United States Patent [19]

Mönch

[11] Patent Number: 5,730,184
[45] Date of Patent: Mar. 24, 1998

[54] BASE BODY FOR PLUMBING FIXTURES

[75] Inventor: Heiner Mönch, Kenn, Germany

[73] Assignee: Ideal-Standard GmbH, Bonn, Germany

[21] Appl. No.: 507,343

[22] PCT Filed: Feb. 5, 1994

[86] PCT No.: PCT/EP94/00325

§ 371 Date: Oct. 18, 1995

§ 102(e) Date: Oct. 18, 1995

[87] PCT Pub. No.: WO94/19633

PCT Pub. Date: Sep. 1, 1994

[30] Foreign Application Priority Data

Feb. 16, 1993 [AT] Austria ................. A287/93

[51] Int. Cl.$^6$ ................. F16K 27/04; F16K 11/074
[52] U.S. Cl. ................. 137/597; 137/269
[58] Field of Search ................. 137/625.17, 625.4, 137/597, 270, 269

[56] References Cited

U.S. PATENT DOCUMENTS 3,952,764  4/1976  Keller, III ................. 137/597 X
4,681,140  7/1987  Hayman ................. 137/597

FOREIGN PATENT DOCUMENTS

| 0569910 | 11/1993 | European Pat. Off. |
| 0572937 | 12/1993 | European Pat. Off. |
| 0572939 | 12/1993 | European Pat. Off. |
| 2065284 | 4/1973 | Germany |
| 2014552 | 1/1976 | Germany |
| 3329829 | 2/1985 | Germany |
| 87093652 | 1/1988 | Germany |
| 8709865 | 7/1988 | Germany |
| 9101627 | 6/1991 | Germany |
| 9112021 | 1/1992 | Germany |
| 91120217 | 1/1992 | Germany |
| 670687 | 6/1989 | Switzerland |

*Primary Examiner*—John Rivell
*Attorney, Agent, or Firm*—Herbert Dubno; Amdrew Wilford

[57] ABSTRACT

In order to adapt a base body for sanitary fittings to a selected cartridge (10, 30), the base body (1) is linked to a cap (2, 32) provided with water through channels (3, 4, 5) whose ends at the side of the cap (2, 32) facing the cartridge (10, 30) are sized and shaped to correspond to the water inlets and outlets of the cartridge (10, 30).

3 Claims, 3 Drawing Sheets

BASE BODY FOR PLUMBING FIXTURES

CROSS REFERENCE TO RELATED APPLICATIONS

This application is the US national phase of PCT application PCT/EP94/000325 filed 5 Feb. 1994 with a claim to the priority of Austrian application A 287/93 itself filed 16 Feb. 1993.

FIELD OF THE INVENTION

The invention relates to a base body for plumbing fixtures.

BACKGROUND OF THE INVENTION

Plumbing fixtures are formed of a base body which can be concealed or exposed, a cartridge that is mounted on the base body, and a housing as well as one or more handles that are connected to the cartridge and which under some circumstances can secure the housing in position.

According to the functional requirements and the desired external appearance, the cartridge, housing, and handle are differently formed. Since the surface of the base body must correspond with the water throughflow openings of the overlying surface of the cartridge, up to now there has always been for each individual embodiment of the cartridge a correspondingly formed base body.

This precise arrangement of the base body relative to the cartridge in a particular plumbing fixture has several disadvantages. The manufacturer must produce several types of base bodies and, like the dealer and installer, must stock a certain number of each base body, e.g. for repairs. If a buyer wants to change the cartridge, if necessary with the housing and handle, with another model, the base body must be switch also even when it is still perfectly functional. In particular in concealed installations this not only entails an unnecessary expense, but also requires basic installation work.

In addition in new construction or renovation of a building the water piping is roughed in at a relatively early stage. When a concealed fixture according to the state of the art is to be used one must at this time face the architectural question of the entire fixture.

OBJECT OF THE INVENTION

It is an object of the invention to develop a construction for plumbing fixtures that allows one to use the same base body for different cartridges.

SUMMARY OF THE INVENTION

This object is attained in that the base body in order to fit with a selected cartridge is sealingly connected with a cover having water-throughflow passages whose ends on the side of the cover turned toward the cartridge correspond in size and shape to the water inlets and outlets of the cartridge. The cover can be lie directly sealingly on the base body and be mounted thereon by screws. According to the shape and path followed by the throughflow passages the water path in the cover is if necessary restricted or widened and the openings are provided on the side turned toward the cartridge at positions corresponding to those of the mixed-water fixture.

Further according to the invention between the base body and the cover there can be a spacer ring and connecting parts to connect the water inlets and outlets in the cover. In the thus produced intermediate space one can mount a sound damper or a switchover device for two water outlets, and even the connecting parts can be formed according to function.

BRIEF DESCRIPTION OF THE DRAWING

The invention is described below more closely with reference to the embodiments shown in the attached drawings in which.

Both embodiments represent a bath fitting with the possibility of switching between the tub and the shower.

Figure 1:
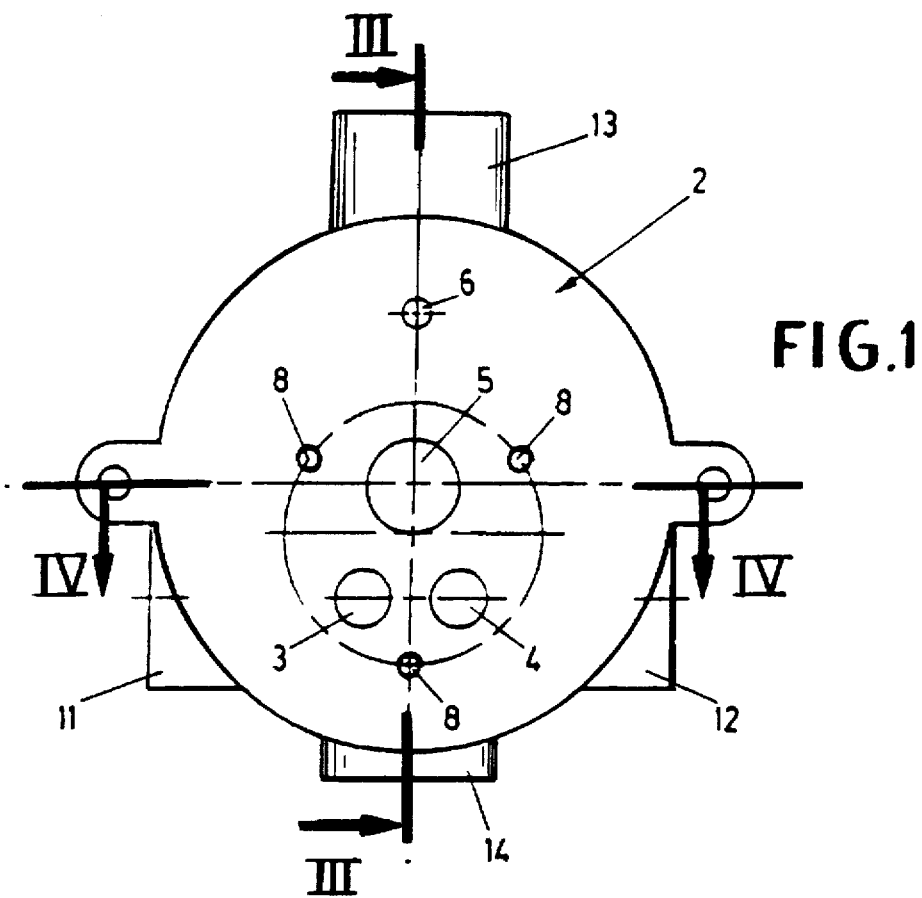
FIG. 1 is a top view of a base body carrying a cover.
Figure 2:
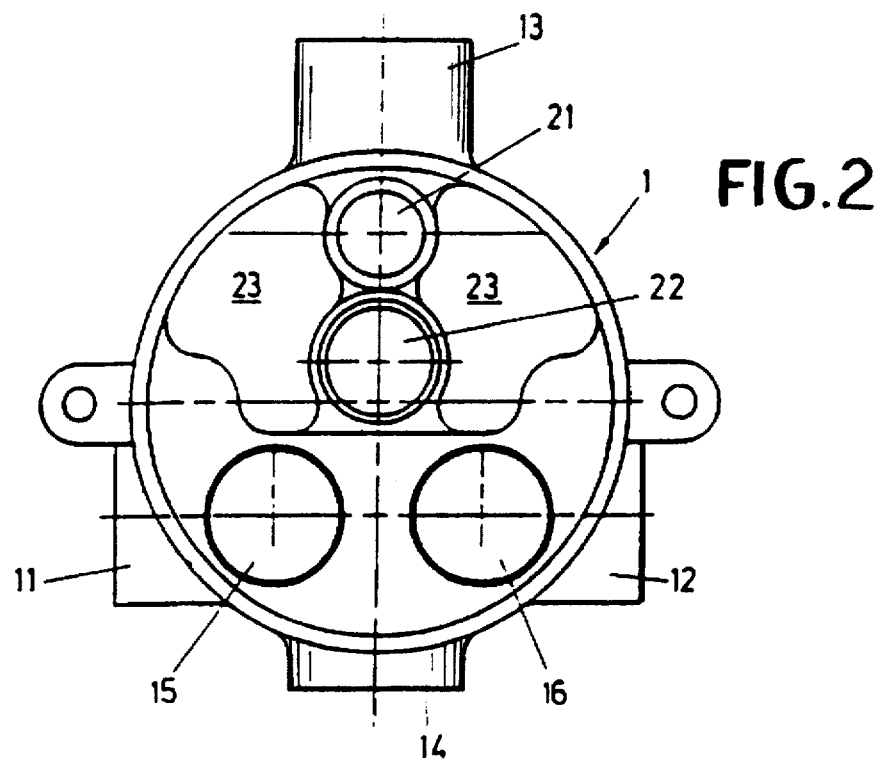
FIG. 2 is a top view of the base body without the cover.
Figure 3:
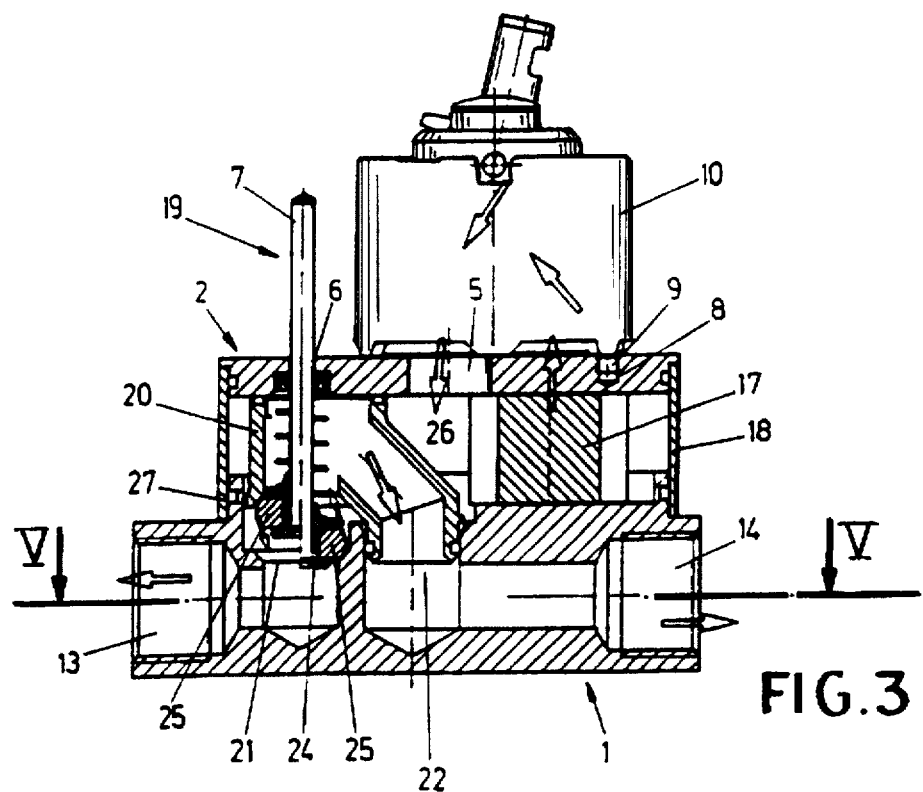
FIG. 3 is a section through the base body according to line III—III of FIG. with the cartridge in place.
Figure 4:
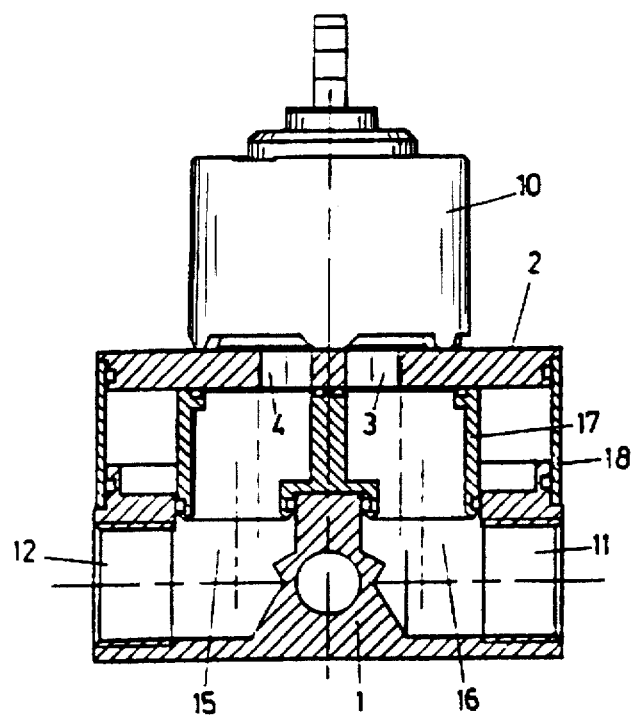
FIG. 4 is a section through the base body according to line IV—IV of FIG. 1 with the cartridge in place.
Figure 5:
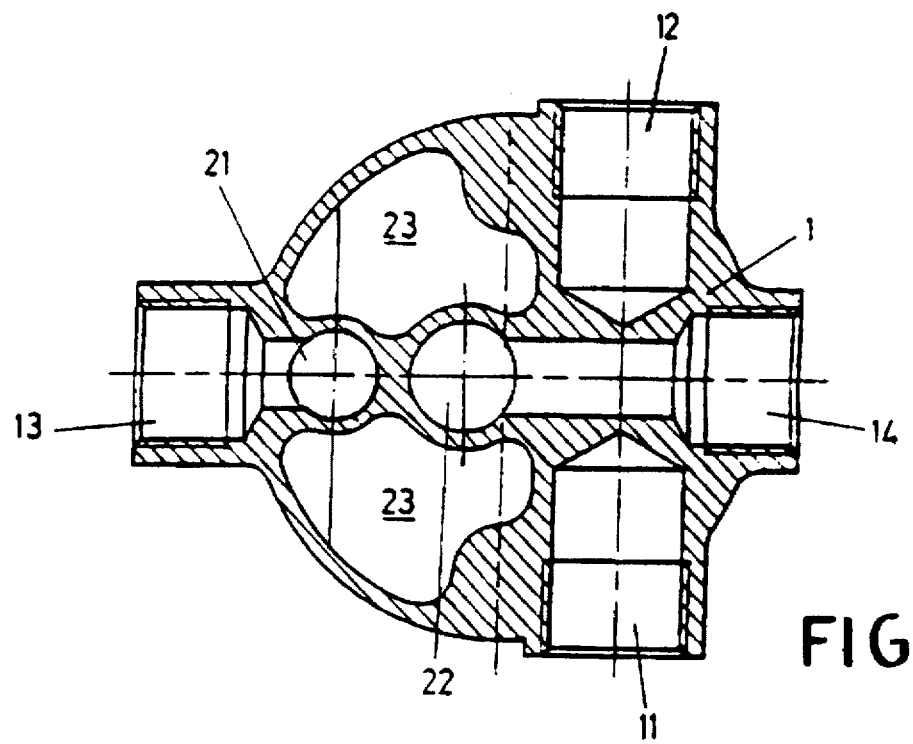
FIG. 5 is a section through the base body according to line V—V of FIG. 3.

The base body 1 shown in FIG. 2 is shown connected with the cover 2 via a spacer ring 18 and several connecting parts 17 and 20 as shown in FIGS. 3 and 4. The cover 2 has hot- and cold-water holes 3 and 4 and a mixed-water hole 5. In addition a bore 6 is provided for a pull rod 7 of a water-path changer 19 as well as blind bores 8 in which corresponding pins or screws 9 of a cartridge 10 engage.

The base body 1 has respective hot- and cold-water inlet connections 11 and 12 which open into bores 15 and 16 and has a shower outlet passage 13 having an inlet opening 21 as well as a tub outlet passage 14 having an inlet opening 22. In addition there is a mixed-water chamber 23.

FIG. 3 shows the water-path changer 12 as a pull rod 7 which is formed on its lower end with a part 24 carrying an O-ring 25. The left side of the water-path changer 19 is in the shower position, the right side in the tub position. Between the cover 2 and the base body 1 are the spacer ring 18 and the connecting parts 17 and 20.

FIGS. 3 and 4 show the path of the water. Hot and cold water pass from the hot- and cold-water connections 11 and 12 via the bores 15 and 16 and the connecting part 17 through the holes 3 and 4 in the cover 2 of the cartridge 10. The mixed water exiting underneath the cartridge 10 is brought through the mixed-water hole 5 in the cover 2 into the inner compartment 26 of the spacer ring 18 and into the chambers 23 of base body 1 where it flows around the connecting parts 17 and 20. Then the mixed water goes through an annular opening 27 between the connecting part 20 and the base body 1 and flows according to the position of the water-path changer 9 into the opening 21 of the shower outlet passage 13 or via the connecting part 20 into the opening 22 of the tub outlet passage 14.

Figure 6:
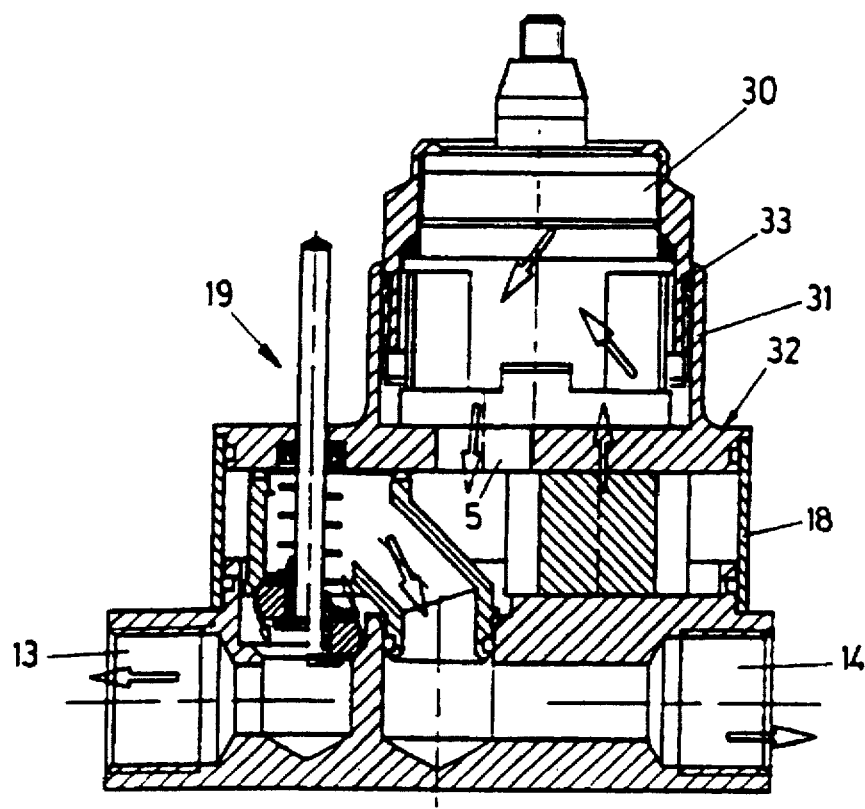
FIG. 6 is a longitudinal section through the base body with another embodiment of the cover corresponding to another cartridge.

FIG. 6 shows the same base body as in FIGS. 1 through 5 but connected with another cartridge 30. The illustrated cartridge 30 is an open cartridge whose mixed-water output is on the side. The cover 32 is correspondingly formed with a sleeve-like extension 31 that is sealed against the cartridge 30 by the seal 33. The mixed water thus flows into the space between the cartridge 30 and the extension 31 of the cover 32 and is fed to the mixing aperture 5 in the cover 32 whence it follows the above-described water path in the base body.

Of course the same base body can be used only for shower fixtures or only for tub fixtures in which case the opening 22 of the tub outlet passage 14 or the opening 21 of the shower outlet passage 13 is closed by means of an appropriate plastic molded part. The water-path changer 19 thus is also left out.

It is conceivable that the base body could be formed differently and that any type of cartridge could be used by means of an appropriate cover with any base body.

I claim:

1. A base body for a plumbing fixture wherein the base body in order to fit with a selected cartridge is sealingly connected with a cover having water-throughflow passages whose ends on the side of the cover turned toward the cartridge correspond in size and shape to the water inlets and outlets of the cartridge and wherein between the base body and the cover there is a spacer ring and connecting parts to connect the water inlets and outlets in the cover.

2. In combination:

a base body formed with at least one water inlet and at least one water outlet and having a face formed with inlet and outlet ports communicating with the respective inlet and outlet;

a cartridge having at least one water inlet and at least one water outlet; and a cover separate from the base body and cartridge and formed with an inlet passage and an outlet passage and with a side at which the passages open, the cover being fitted to the base body with its side sealingly engaged on the face of the base body, with the cartridge sealingly engaged with the cover, and with the inlet passage extending from the inlet port to the cartridge inlet and the outlet passage extending from the outlet port to the cartridge outlet.

3. The base body according to claim 2 wherein the cover carries on its side turned away from the base body a sleeve-like extension with a seal engaging the cartridge.

* * * * *